United States Patent
Watanabe et al.

(10) Patent No.: US 7,441,711 B2
(45) Date of Patent: *Oct. 28, 2008

(54) SEMICONDUCTOR DEVICE AND IC CARD

(75) Inventors: Kazuki Watanabe, Kokubunji (JP);
Hisataka Tsunoda, Oomama (JP);
Norihisa Yamamoto, Kodaira (JP);
Kazuhiro Matsushita, Kodaira (JP)

(73) Assignees: Renesas Technology Corp., Tokyo (JP);
Hitachi Ulsi Systems Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/651,096

(22) Filed: Jan. 9, 2007

(65) Prior Publication Data

US 2007/0108301 A1    May 17, 2007

Related U.S. Application Data

(63) Continuation of application No. 10/512,480, filed as application No. PCT/JP02/04243 on Apr. 26, 2002, now Pat. No. 7,168,624.

(51) Int. Cl.
*G06K 19/06* (2006.01)
(52) U.S. Cl. .................. 235/492; 343/895; 343/742; 343/867
(58) Field of Classification Search ............... 235/492; 343/895, 742, 867
See application file for complete search history.

(56) References Cited

U.S. PATENT DOCUMENTS 5,670,772 A    9/1997    Goto
6,173,899 B1    1/2001    Rozin
7,168,624 B2 *    1/2007    Watanabe et al. ........... 235/492
2001/0026186 A1    10/2001    Watanabe et al.

FOREIGN PATENT DOCUMENTS

| EP | 1 139 280 A2 | 10/2001 |
|---|---|---|
| JP | 07-245947 | 9/1995 |
| JP | 10-207580 | 8/1998 |
| JP | 10-326690 | 12/1998 |
| JP | 110073481 A | 3/1999 |
| JP | 2001-238372 | 8/2001 |
| JP | 2002-027740 | 1/2002 |

* cited by examiner

*Primary Examiner*—Michael G. Lee
*Assistant Examiner*—Kristy A Haupt
(74) *Attorney, Agent, or Firm*—Antonelli, Terry, Stout & Kraus, LLP.

(57) ABSTRACT

In an IC card in which an internal circuit is operated by an internal power supply formed from alternate current from outside received by an antenna, the voltage of the internal power supply sometimes changes due to the operation of the internal circuit. Therefore, the voltage controlling circuit of the present invention includes a voltage controlling current source, and when the internal circuit is not operated and the current higher than a predetermined current is detected in the voltage controlling current source, an operating current detector circuit outputs an enable signal. When the internal circuit is operated in response to the enable signal, the current consumed in the internal circuit is subtracted from the current passing through the voltage controlling current source. Consequently, the current change in the entire internal power supply can be prevented, and the output voltage of the internal power supply can be kept constant.

18 Claims, 7 Drawing Sheets

SEMICONDUCTOR DEVICE AND IC CARD

This application is a continuation of U.S. application Ser. No. 10/512,480, filed Jun. 23, 2005 (now U.S. Pat. No. 7,168,624), which is the Natl. Stage of Intl. Appln. Ser. No. PCT/JP02/04243, filed Apr. 26, 2002, the entire disclosures of which are incorporated herein by reference.

TECHNICAL FIELD OF THE INVENTION

The present invention relates to a semiconductor device. More particularly, the present invention relates to a circuit for detecting whether or not power for operating a signal processing unit mounted in a semiconductor integrated circuit device for contactless IC card is present.

BACKGROUND OF THE INVENTION

The documents cited in this specification are as follows, and these documents are cited based on their document numbers. Document 1: Japanese Patent Application Laid-Open No. 10-207580. The document 1 describes a voltage-monitoring type power on reset circuit (for example, FIG. 2) mounted in a contactless IC card which is operated by the operating voltage formed by rectifying the alternate current (AC) supplied from outside. The signal outputted from this power on reset circuit is used for the reset of the microcomputer mounted in the IC card.

The so-called contactless IC card in which a semiconductor integrated circuit device and an antenna are provided exchanges the information between an interrogator and the semiconductor integrated circuit device, and it is used to achieve various functions such as the transmission of the data held by the contactless IC card and the storage of the data transmitted from the interrogator. The semiconductor integrated circuit device mounted in the contactless IC card receives a high frequency signal supplied from the interrogator by the antenna mounted in the contactless IC card and rectifies and smoothes the voltage generated at both ends of the antenna to form an internal voltage necessary for the operation of the internal circuit. In this case, when excessive power is supplied from the interrogator and the power supply voltage higher than the withstand voltage of the devices constituting the internal circuit is supplied, the devices are broken. For its prevention, a control circuit for monitoring the power supply voltage level generated inside is provided in many cases so as not to supply the power supply voltage higher than the withstand voltage of the devices.

Meanwhile, the signal processing circuit mounted in the semiconductor integrated circuit device in the contactless IC card detects the power supply voltage level generated as described above, and if the power supply voltage reaches a level where the signal processing circuit mounted in operates without malfunction, the signal processing circuit is operated and if the power supply voltage does not reaches a level where the signal processing circuit operates without malfunction, the signal processing circuit is stopped. As an example of this type, the document 1 discloses a signal processing circuit which detects the power supply voltage level and if the power supply voltage is lower than a predetermined voltage level, the signal processing circuit is transitioned to a reset state and stopped and if the power supply voltage is higher than the predetermined voltage level, the reset state is released to operate the signal processing circuit.

Prior to this application, the inventors of the present invention have examined the problems caused when the semiconductor integrated circuit device provided with the voltage-monitoring type reset circuit according to the document 1 is used in the contactless IC card.

FIG. 1 shows the current (I)-voltage (V) characteristics VL examined by the inventors of the present invention, which are outputted from a rectifier circuit in the case where power is supplied in the form of electromagnetic wave from the interrogator and the rectifier circuit is connected to an antenna provided in the contactless IC card. In this case, the characteristics VL are represented by the relational expression of $V=V_o-I \cdot R_{out}$. This means that the voltage at both ends of the antenna is changed depending on the current passing through the load connected to the output terminal of the rectifier circuit and is equivalent to the voltage source having the output impedance $R_{out}$. $V_o$ is the voltage when it is assumed that no current passes through the load, and the supply voltage V is reduced when current passes through the load. At this time, the slope of the current-voltage characteristics VL is equal to the output impedance $R_{out}$.

FIGS. 2A and 2B show an example of an operating waveform in the case where the semiconductor integrated circuit device provided with the reset circuit according to the document 1 is connected to the interrogator and the antenna with the current-voltage characteristics VL shown in FIG. 1. The power on reset circuit exemplified in FIG. 2 of the document 1 generates the power on reset signal by comparing the voltage divided by the voltage divider for dividing a power supply voltage and the reference voltage from the bandgap reference circuit. By doing so, when the power supply voltage is higher than a predetermined voltage level VACT, the reset state of the signal processing circuit is released and the signal processing circuit starts to operate.

The reset signal outputted from the reset circuit of the document 1 is checked at the time T0 in FIG. 2 before the signal processing circuit starts to operate, and if the power supply voltage is higher than the predetermined voltage level VACT, the signal processing circuit is operated between the time T1 and time T2. In FIG. 2, since the power supply voltage is higher than the predetermined voltage level VACT at the time T0, the signal processing circuit mounted inside is permitted to operate and the signal processing circuit starts to operate. Therefore, the consumption current when the signal processing circuit is being operated is increased by I1 in comparison to that when it is not operated.

If the output impedance Rout is 0Ω, the change in power supply voltage level due to the change in consumption current does not occur, and the signal processing circuit can be operated by the power supply voltage higher than the predetermined power supply voltage level VACT. However, when the output impedance Rout is high, the power supply voltage VDD drops by the product of the change in consumption current and the output impedance Rout. Therefore, since the power supply voltage lower than the predetermined power supply voltage level VACT by the product of the change in consumption current and the output impedance Rout is supplied to the signal processing circuit, the signal processing circuit is operated by the voltage lower than the predetermined power supply voltage level. Consequently, there is the possibility that the characteristics of the signal processing circuit are changed and the malfunction due to the characteristic degradation occurs.

An object of the present invention is to provide a semiconductor integrated circuit device having a function to output a reset signal for operating a signal processing circuit at a predetermined power supply voltage even when the current is changed due to the operation of the signal processing circuit.

SUMMARY OF THE INVENTION

The typical ones of the inventions disclosed in this application will be briefly described as follows. That is, an IC card in which an internal circuit is operated by an internal power supply formed in a voltage controlling circuit by alternate current from outside received by an antenna is provided, in which the operation of the internal circuit is controlled by the operating current detector circuit which detects the supplied current of the internal power supply. Here, the voltage controlling circuit of the present invention includes a voltage controlling current source, and when the current higher than a predetermined current I1 flows in the voltage controlling current source while the internal circuit is not operated, the operating current detector circuit outputs an enabling signal. When the internal circuit is operated by receiving the enabling signal, the current I1 consumed in the internal circuit is subtracted from the current passing through the voltage controlling current source. As a result, since the change in current in the whole internal power supply can be prevented, the output voltage of the internal power supply can be kept constant practically.

BRIEF DESCRIPTIONS OF THE DRAWINGS

DESCRIPTIONS OF THE PREFERRED EMBODIMENTS

Hereinafter, preferred embodiments of a semiconductor device and an IC card according to the present invention will be described in detail with reference to the accompanying drawings.

First Embodiment

Figure 3:
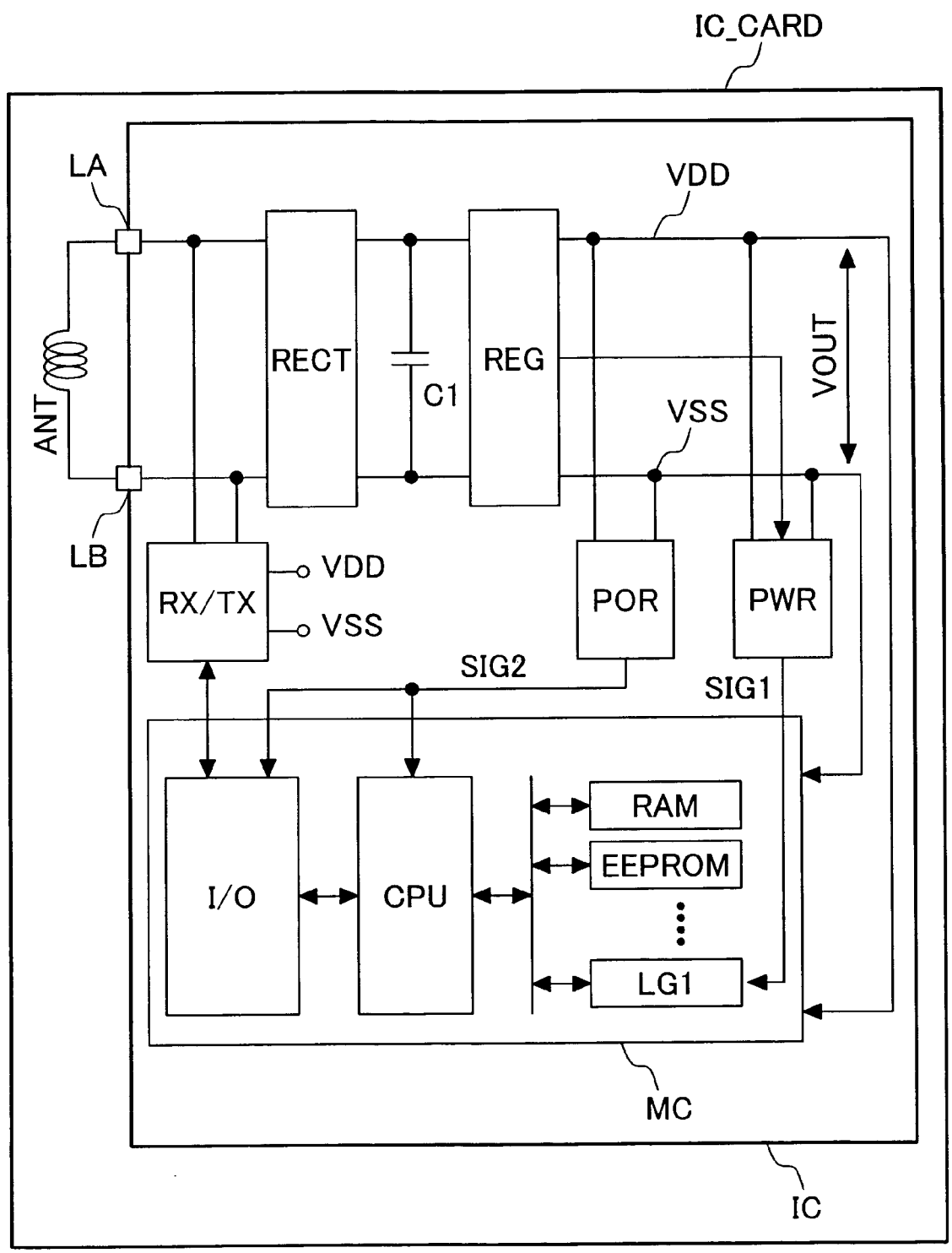
FIG. 3 is a block diagram showing an embodiment of a contactless IC card according to the present invention.

FIG. 3 is a block diagram of an embodiment of a semiconductor integrated circuit device provided with an operating current detector circuit according to the present invention and a contactless IC card having the semiconductor integrated circuit device mounted therein. The signal and power outputted in the form of electromagnetic wave from an interrogator (not shown) through an antenna are received by an antenna ANT incorporated in an IC card IC_CARD. Typically, the antenna ANT is an antenna coil formed of wound spiral of wire of a printed circuit board. The semiconductor integrated circuit IC is mounted on the printed circuit board having this antenna ANT formed thereon. This printed circuit board is molded with resin to form the IC card. Typically, the present invention is applied to a contactless IC card which does not have electrodes for I/O to and from outside on its surface. Of course, it is also possible to apply the present invention to a dual-type IC card which has a contactless interface and electrodes for I/O.

Though not particularly limited, the semiconductor integrated circuit IC in FIG. 3 is formed on one semiconductor substrate made of, for example, monocrystal silicon by the conventional technique for manufacturing a semiconductor integrated circuit. A rectifier circuit RECT rectifies alternate current received by the antenna ANT provided in the contactless IC card, and a smoothing capacitor C1 smoothes the voltage rectified by the rectifier circuit RECT to generate direct power supply voltage. The voltage controlling circuit (or voltage controlling means) REG is means for monitoring and controlling power supply voltage level so as not to supply the power supply voltage higher than withstand voltage of the devices constituting a circuit connected to the direct power supply voltage. The voltage difference VOUT of the power supply voltage VDD-VSS controlled by the REG is supplied as the operating power supply voltage of an internal circuit MC, a power on reset circuit POR, a current detector circuit PWR, and a communication circuit RX/TX.

The power on reset circuit POR is a power on reset generator circuit which monitors the power supply voltage VDD and sometimes generates a power on reset signal SIG2 at power on. The power on reset signal is supplied to a circuit whose internal state needs to reset at power on such as a microcomputer MC.

The current detector circuit PWR determines that the current passing through the voltage controlling circuit REG is higher than the predetermined current and outputs the detection signal SIG1. The SIG1 is used to control the operation of the microcomputer MC as an internal circuit. The internal circuit MC typically includes an interface circuit (I/O) for the communication circuit RX/TX, a central processing unit (CPU), a nonvolatile memory unit composed of a RAM, a flash memory, or EEPROM, and a co-processor. In this case, since the information is encoded in the communication using the IC card with outside, the co-processor is necessary for decoding the encoded received data. The co-processor consumes relatively large operating current when it starts to operate, which frequently causes the voltage drop. Therefore, in an example of the present invention, the detection signal SIG1 is used to control the operation of one co-processor in the internal circuit. Usually, the co-processor starts to operate when the operation request from the CPU and the enable condition of the SIG1 are satisfied in the AND condition. The LG1 in the internal circuit MC in FIG. 3 usually represents a circuit block performing one function, and the co-processor is one of the typical examples thereof in this embodiment.

The interrogator RX/TX includes a receiver and a transmitter. The receiver demodulates the information signal superposed in the alternate current received by the antenna ANT provided in the contactless IC card and supplies the demodulated signal to the internal circuit MC as a digital information signal. The receiver also has a function to generate a clock signal. Meanwhile, the transmitter receives the digital information signal outputted from the internal MC and forms alternate current to be outputted to the outside through an antenna.

Figure 4:
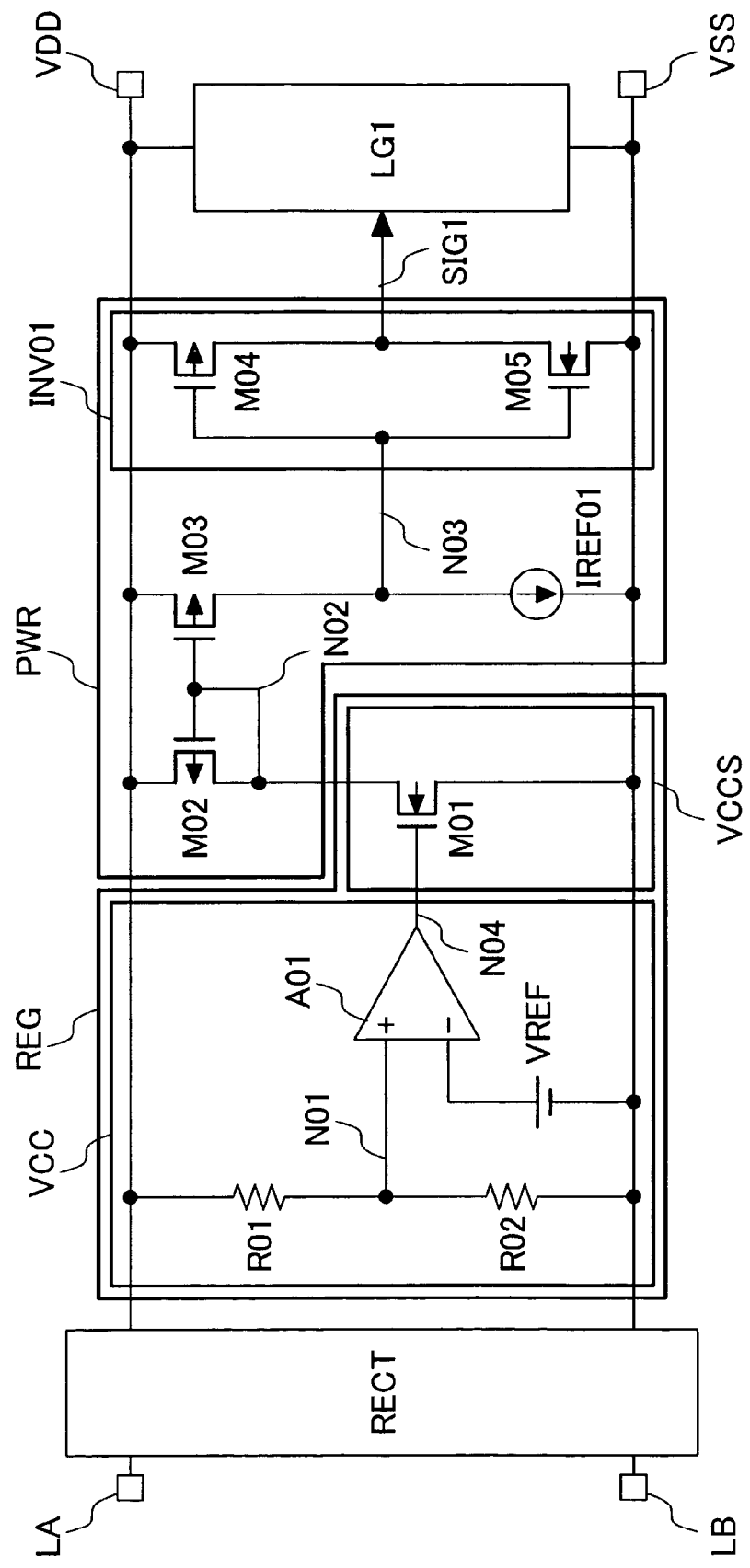
FIG. 4 is a basic circuit configuration diagram showing an embodiment of an operating current detector circuit mounted in a semiconductor device according to the present invention.

FIG. 4 shows a basic circuit configuration of an embodiment of the operating current detector circuit PWR according to the present invention. In FIG. 4, the voltage controlling circuit REG which controls the potential difference VOUT between the power supply potential VDD and the reference potential VSS to be constant is provided between the power supply potential VDD and the reference potential VSS, and a voltage comparator circuit VCC which forms detection voltage corresponding to the change in output voltage VOUT formed by the voltage controlling current source VCCS is provided between the power supply potential VDD and the reference potential VSS. The voltage controlling current source VCCS controls the potential difference VOUT by means of the detection voltage outputted by the voltage comparator circuit VCC.

The voltage comparator circuit VCC is composed of the circuit described below. More specifically, a voltage divider resistors R01 and R02 are provided between the power supply potential VDD and the reference potential VSS. The divided voltage obtained at a connection node N01 between the voltage divider resistors R01 and R02 is supplied to the noninversion input (+) of an operational amplifier circuit A01. The reference voltage source VREF is connected between an inversion input (−) of the operational amplifier circuit A01 and the reference potential VSS.

The voltage controlling current source VCCS in FIG. 4 is composed of the circuit described below. More specifically, an NMOS transistor M01 whose gate terminal is connected to the output terminal of the operational amplifier circuit A01 is connected between the connection node N02 and the reference potential VSS. Hereinafter, the NMOS transistor, namely, an n type MOSFET is abbreviated to NMOS, and PMOS transistor, namely, a p type MOSFET is abbreviated to NMOS. In the present invention, the case where a typical MOSFET (Metal Oxide Semiconductor Field Effect Transistor) is used as an example will be described. However, it is also possible to use the MISFET (Metal Insulator Semiconductor Field Effect Transistor).

The operating current detector circuit PWR is composed of the circuit described below. More specifically, the PMOS transistor M02 whose gate terminal and drain terminal are connected between the power supply potential VDD and the connection node N2 is connected and the PMOS transistor M03 whose gate terminal is connected to the connection node N02 is connected between the power supply potential VDD and the connection node N03. In this case, the size of the PMOS transistor M03 is N times as large as that of the PMOS transistor M02. The M02 and M03 form the current mirror circuit, which monitors the current passing through the M01 and transfers the current as the drain current of the M03. The reference current source IREF01 is connected between the connection node N03 and the reference potential VSS, the connection node N02 is connected to an input terminal of an inverter INV01 composed of the PMOS transistor M04 and the NMOS transistor M05, and an output terminal of the inverter INV01 is set to the detection signal SIG1 of FIG. 4. In this case, since the current passing through the PMOS transistor M03 can be reduced by setting the N to a value much smaller than 1, the error in the current to be detected by the operating current detector circuit PWR can be reduced. In addition, the advantage that the consumption current can be reduced is also achieved. Consequently, it is preferable that N is set to a value in the range of 0.1 to 0.01.

Note that the operation of the operating current detector circuit PWR can be understood as follows. That is, when the gate of the M03 in which a constant current passes by means of the current source IREF01 is influenced due to the change in potential of the node N02, the impedance of the M03 is changed and the voltage of the node N03 is also changed. The potential of the N03 is determined by the inverter INV1 to form the SIG1.

When the voltage level of the output voltage VOUT does not reach the predetermined voltage, current does not flow through the voltage controlling current source VCCS. On the other hand, when the voltage level of the output voltage VOUT reaches the predetermined voltage, current flows through the voltage controlling current source VCCS, and the negative feedback is applied by the output impedance Rout of the power supply source by the interrogator and the antenna so as to reduce the output voltage VOUT.

The operating current detector circuit PWR which detects the current proportional to the current passing through the voltage controlling current source VCCS to determine whether or not the current reaches the predetermined level is provided. When the operating current detector circuit PWR determines that the current passing through the voltage controlling current source VCCS reaches the predetermined level, it issues the detection signal SIG1.

The detection signal SIG1 of the operating current detector circuit PWR is inputted to the microcomputer MC of FIG. 3, and the operation and non-operation of the circuit block LG1 is controlled by the detection signal SIG1. Therefore, when the output voltage VOUT of the voltage controlling current source VCCS reaches a predetermined level and further the current passing through the voltage controlling current source VCCS reaches a predetermined current, that is, when power necessary to operate the circuit block LG1 is applied, the detection signal SIG1 activates the circuit block LG1.

In this embodiment, when the divided voltage obtained at the connection node N01 is higher than the reference voltage VREF, the current starts to flow through the NMOS M01 and the PMOS M02. The negative feedback is applied by this current and the output impedance Rout so as to reduce the output voltage VOUT.

When the current passing through the NMOS M03 is lower than the current source IREF1, the potential at the connection node N03 is equivalent to the reference potential VSS, and "H" is outputted to the detection signal SIG1 of the inverter INV01. The current passing through the NMOS M03 is higher than the current source IREF01, the potential at the connection node N03 is equivalent to the reference potential VSS, and "L" is outputted to the detection signal SIG1 of the inverter INV01. At this time, the current passing through the NMOS M01 is 1/N times as high as that of the current source IREF1. In this case, the current 1/N times as high as that of the current source IREF1 is set to be higher than the consumption current I1 of the circuit block LG1 activated by the detection signal SIG1.

When the detection signal SIG1 is "H", the circuit block LG1 is stopped. When the detection signal SIG1 is "L", the LG1 is operated. When the LG1 is operated, the consumption current is increased and the output voltage VOUT is decreased due to the output impedance Rout. However, the current passing through the NMOS M01 is reduced by the negative feedback and the output voltage VOUT is controlled to be a predetermined voltage.

Figure 1:
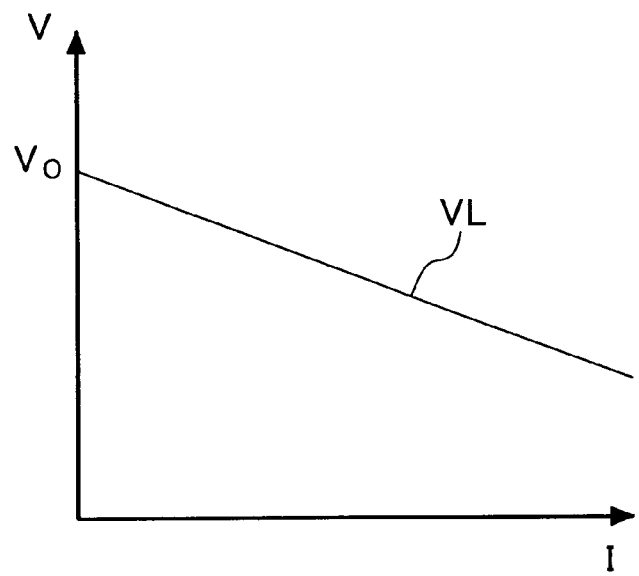
FIG. 1 is a graph showing the current-voltage characteristics of an interrogator and an antenna for describing the present invention.
Figure 2A:
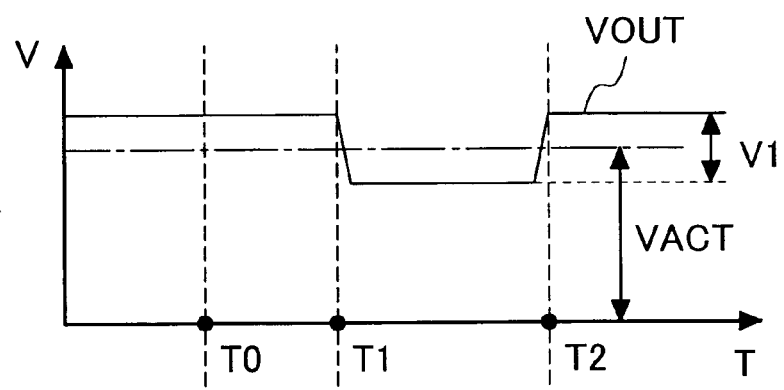
FIGS. 2A and 2B are waveform diagrams for describing the operation of a voltage-monitoring type power on reset circuit.
Figure 2B:
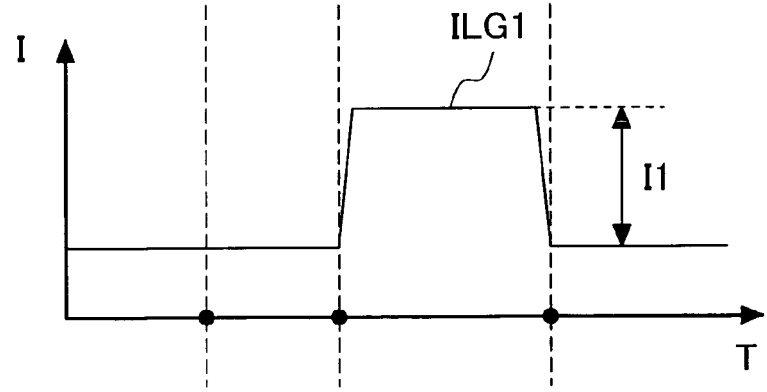
Figure 5A:
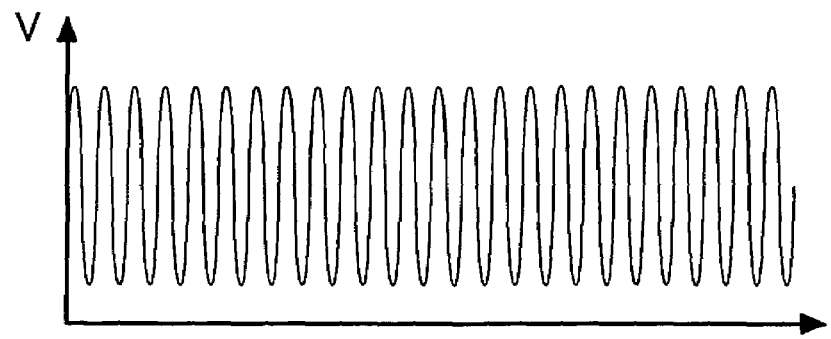
FIGS. 5A to 5D are graphs showing the operating waveform of the operating current detector circuit mounted in a semiconductor device according to the present invention.
Figure 5B:
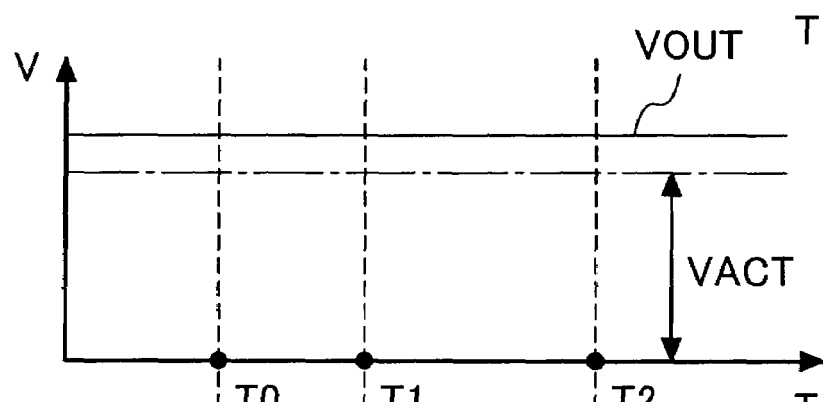
Figure 5C:
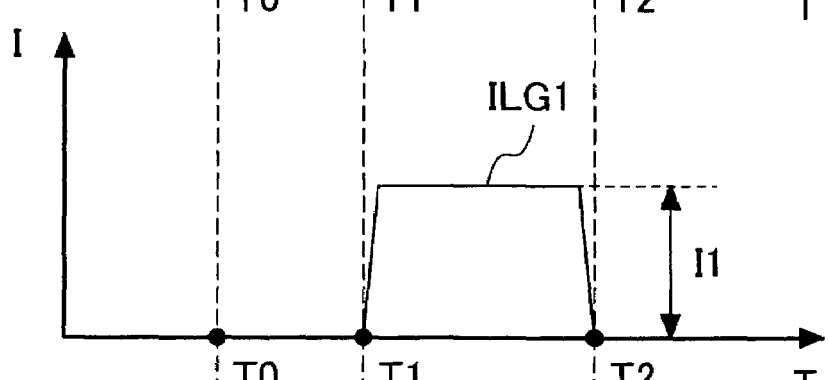
Figure 5D:
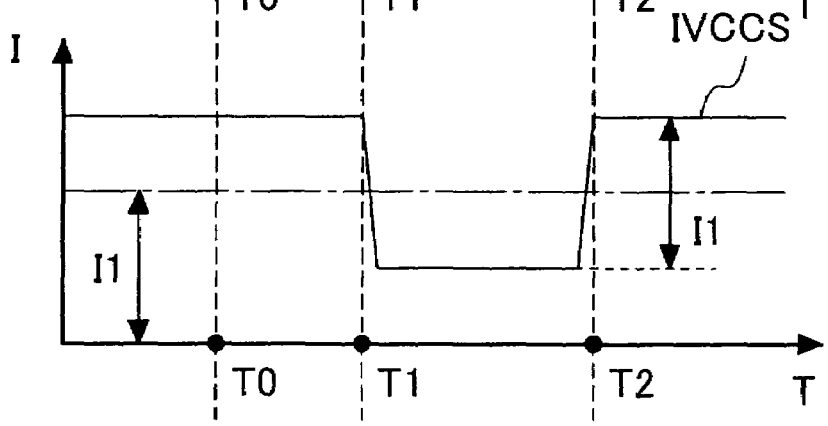

FIGS. 5A to 5D show an example of the operating waveforms in the case where the semiconductor integrated circuit device in FIG. 3 provided with the operating current detector circuit in FIG. 4 is connected to the interrogator and the antenna having the current-voltage characteristics shown in FIG. 1. FIG. 5A shows the change with time of the alternate waveform inputted to the antenna ANT, FIG. 5B shows the change with time of the output voltage VOUT, FIG. 5C shows the change with time of the current ILG1 passing through the circuit block (co-processor) LG1, and FIG. 5D shows the change with time of the current IVCCS passing through the voltage controlling circuit VCCS (more concretely, M01). Note that, in the alternate waveform in FIG. 5A, the digital signal which is phase-modulated by the sine wave is superposed. This sine wave typically has the frequency of about 13.56 MHz, and the time axis is magnified in these drawings.

The detection signal SIG1 outputted from the operating current detector circuit shown in FIG. 4 is checked at the time T0 before the circuit block LG1 starts to operate, and when a predetermined current passes through the voltage controlling current source VCCS, the LG1 is operated from the time T1 to T2. At this time, if the output voltage VOUT reaches a predetermined voltage level and further the current higher than the operating current I1 flows in the voltage controlling current source VCCS, the operation of the signal processing circuit mounted inside is permitted and the signal processing circuit is operated from the time T1 to T2.

By doing so, the circuit block LG1 is activated and the operating current I1 of the LG1 starts to flow. The output voltage VOUT is decreased due to the output impedance Rout. However, the current passing through the voltage controlling circuit is reduced only by the operating current I1 by the negative feedback so as to control the output voltage VOUT to be a predetermined voltage. Therefore, when the signal processing circuit LG1 is operated, the output voltage VOUT is kept constant at any time, and even when the consumption current is changed due to the operation of the LG1, a signal processing circuit can be operated at a predetermined power supply voltage level. More specifically, the voltage controlling circuit REG according to the present invention is configured such that the current higher than the current I1 flows through the M01 of the voltage controlling current source VCCS when the LG1 is not operated and the current I1 consumed in the LG1 is decreased from the current passing through the VCCS when the LG1 is operated. By doing so, the current change in the entire circuit can be prevented and as a result, the output voltage VOUT can be kept constant.

Figure 6:
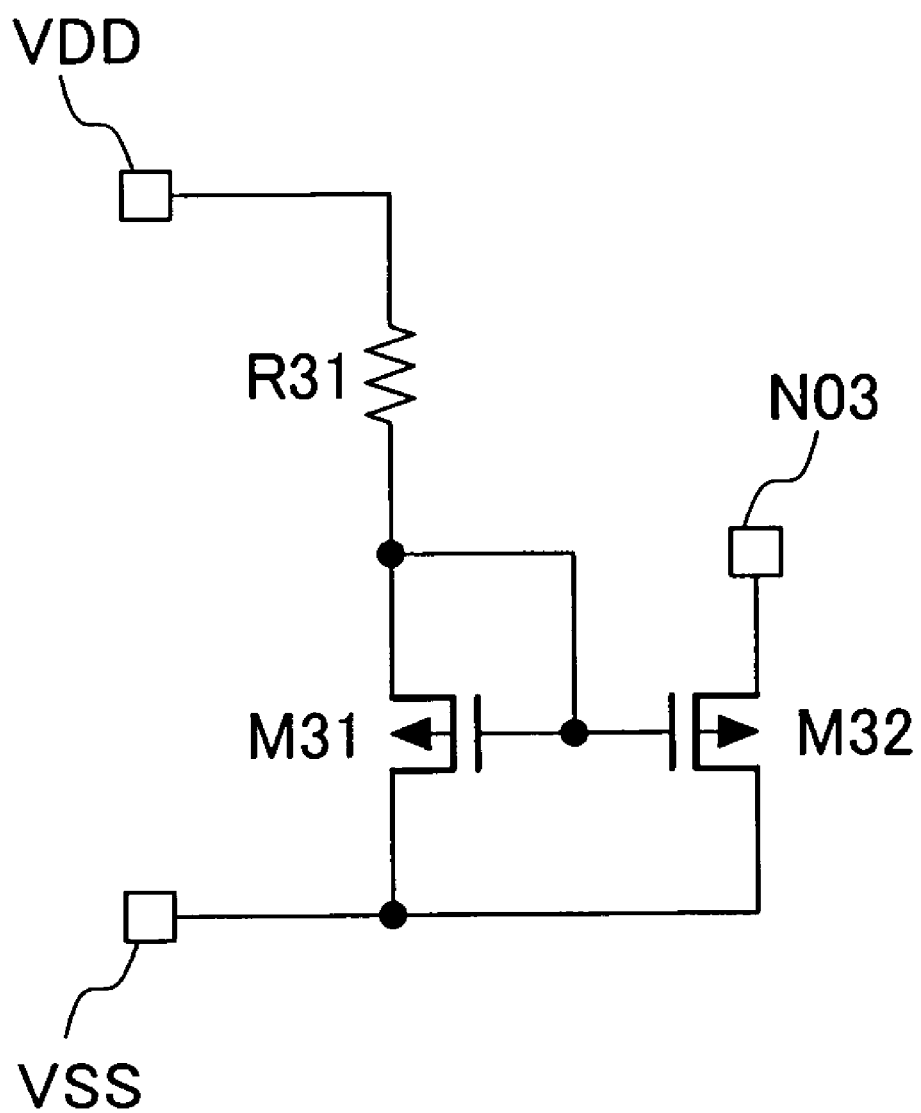
FIG. 6 is a circuit diagram showing an embodiment of a current source applied to the operating current detector circuit mounted in a semiconductor device according to the present invention.

FIG. 6 shows an example of a reference current source IREF01. In FIG. 6, a current-mirror type reference current source is used. The NMOS M31 which is diode-connected and the resistor R31 are connected in series between VDD and VSS to form a reference current circuit and the NMOS M32 connected by means of a current-mirror connection is used as the current source and is connected at the connection node N03. Also, the resistor connected between VSS and N03 can be used as a simpler modification example of the reference current source IREF01.

Second Embodiment

Figure 7:
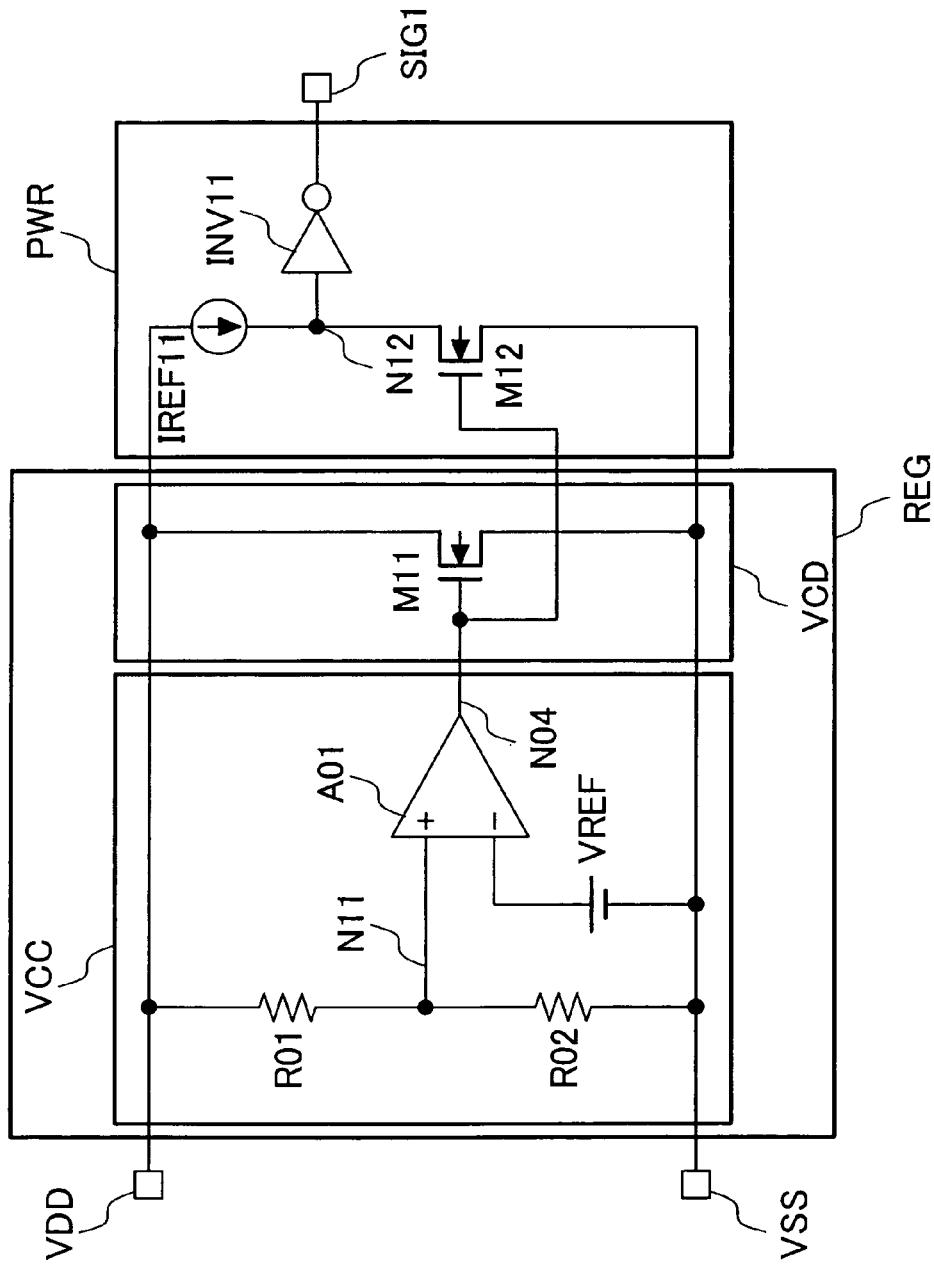
FIG. 7 is a circuit diagram showing another embodiment of the operating current detector circuit mounted in a semiconductor device according to the present invention.

FIG. 7 is a circuit diagram showing another embodiment of the voltage controlling circuit REG and the operating current detector circuit PWR in FIG. 4. The voltage comparator circuit VCC in FIG. 7 has the same configuration as that in FIG. 4. Meanwhile, the voltage controlling current source VCCS differs in that the drain of the NMOS M11 is directly connected to VDD.

The operating current detector circuit PWR in FIG. 7 is composed of the circuit described below. More specifically, the NMOS M12 whose gate terminal is connected to the output terminal of the operational amplifier circuit A01 is connected between the connection node N12 and the reference potential VSS. In this case, the size of the NMOS M12 is N times as large as that of the NMOS transistor M11. The reference current source IREF11 is connected between the power supply potential VDD and the connection node N12, the connection node 12 is connected to the input terminal of the inverter INV11, and the output terminal of the inverter INV11 is set to the detection signal SIG1 in FIG. 4.

The reference current source IREF11 in FIG. 7 can be obtained in the circuit in which VDD and VSS in the circuit of FIG. 6 are inverted so as to change M31 and M32 into the PMOS. Also, the resistor can be used as a simpler example of the reference current source IREF11.

In this embodiment, when the divided voltage obtained at the connection node N11 is higher than the reference voltage VREF, the current starts to flow through the NMOS M11. The negative feedback is applied by this current and the output impedance Rout so as to reduce the output voltage VOUT. Since the size of the NMOS M12 is N times as large as that of the NMOS M11, the current passing through the NMOS M12 is N times as high as that passing through the NMOS M11.

When the current passing through the NMOS M12 is lower than the current source IREF11, the potential at the connection node N12 is equivalent to the power supply potential VDD, and "L" is outputted to the detection signal of the inverter INV11. When the current passing through the NMOS M12 is higher than the current source IREF11, the potential at the connection node N12 is equivalent to the reference potential VSS, and "H" is outputted to the detection signal SIG1 of the inverter INV11. At this time, the current passing through the NMOS M11 is 1/N times as high as the current source IREF1. In this case, the consumption current of the circuit block LG1 activated by the detection signal SIG1 is set to be lower than the current 1/N times as high as that of the current source IREF1.

The circuit block LG1 is controlled by the detection signal SIG1 in the same way as that shown in FIG. 4. Therefore, the circuit in this embodiment shown in FIG. 7 can acquire the same function as that in the embodiment shown in FIG. 4, and further, it is possible to reduce the area used by the transistor.

Third Embodiment

Figure 8:
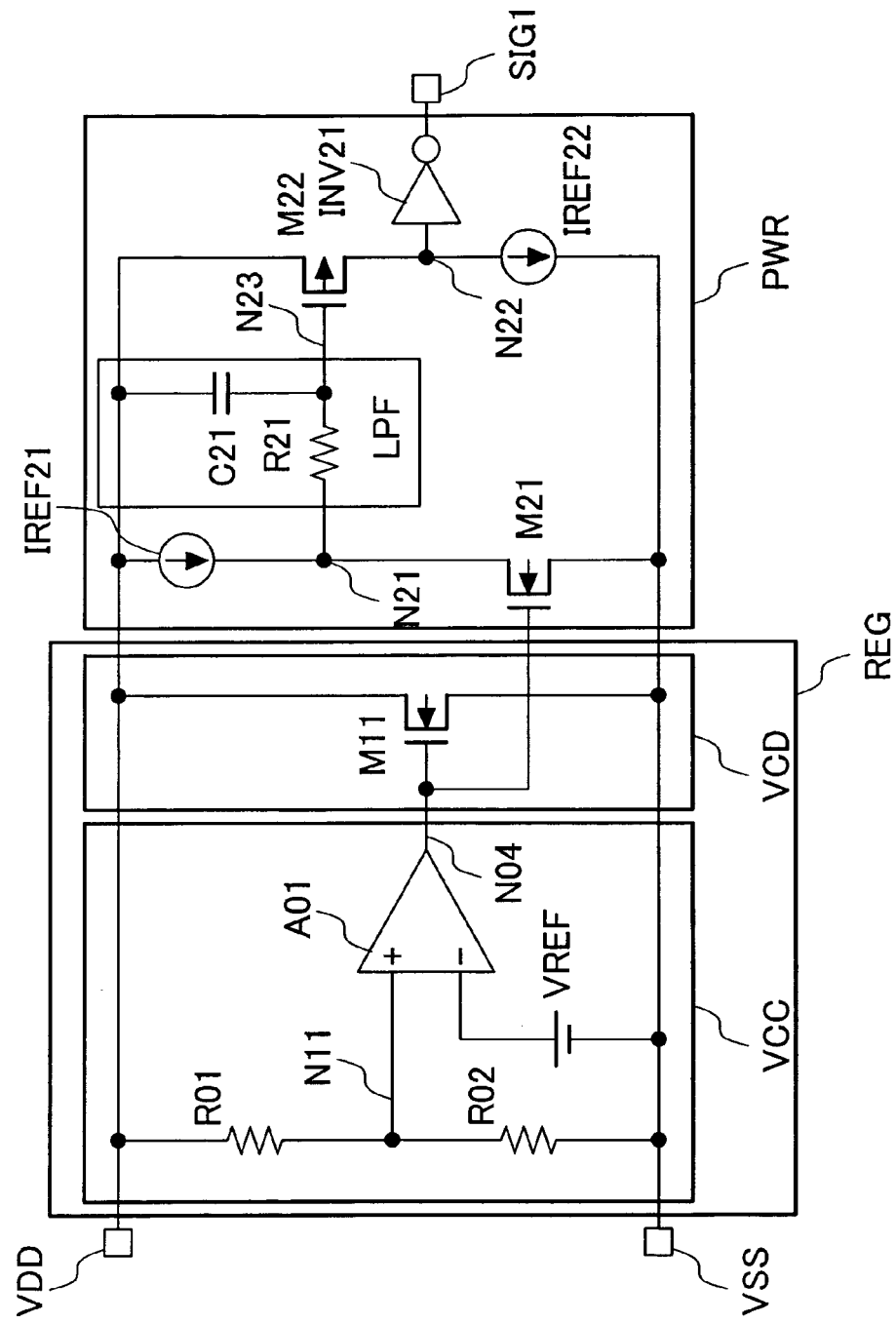
FIG. 8 is a circuit diagram showing another embodiment of the operating current detector circuit mounted in a semiconductor device according to the present invention.

FIG. 8 is a circuit diagram showing another embodiment of the operating current detector circuit PWR mounted in a semiconductor integrated circuit device according to the present invention. In this embodiment, a modification example of the operating current detector circuit PWR shown in FIG. 7 is described.

The operating current detector circuit PWR in FIG. 8 is composed of a circuit described below. That is, the NMOS M21 whose gate terminal is connected to the output terminal of the operational amplifier circuit A01 is connected between the connection node N21 and the reference potential VSS. The reference current source IREF 21 is connected between the power supply potential VDD and the connection node N21, an input terminal of the low pass filter LPF composed of the resistor R21 and the capacitor C11 is connected to the connection node N21, the PMOS M22 whose gate terminal is connected to the output terminal of the low pass filter LPF is connected between the power supply potential VDD and the connection node N22, the reference current source IREF22 is connected between the connection node N22 and the reference potential VSS, the connection node N22 is connected to the input terminal of the inverter INV21, and the output terminal of the inverter INV21 is set to the detection signal SIG1 in FIG. 6. In this case, the low pass filter is used to remove the high-frequency component of the connection node N22, and any circuit configuration can be available for the low pass filter.

The reference current source IREF21 in FIG. 8 can be obtained in the circuit in which VDD and VSS in the circuit of FIG. 6 are inverted so as to change M31 and M32 into the PMOS. Also, the reference current source IREF22 can be obtained by the same circuit shown in FIG. 6. The resistor can be used as a simpler example of the IREF21 and IREF22.

In this embodiment, when the current passing through the NMOS M21 is lower than the current source IREF21, the potential at the connection node N21 is equivalent to the power supply potential VDD and "H" is outputted to the detection signal SIG1 of the inverter INV21. When the current passing through the NMOS M21 is higher than the current source IREF21, the potential at the connection node N21 is equivalent to the reference potential VSS and "L" is outputted to the detection signal SIG1 of the inverter INV21. At this time, the current passing through the NMOS N11 is 1/N times as high as the current source IREF21.

The circuit block LG1 is controlled by the detection signal SIG1 in the same way as that shown in FIG. 4. Therefore, the circuit in this embodiment shown in FIG. 8 can acquire the same function as that in the embodiment shown in FIG. 4, and further, it is possible to reduce the pass current of the detector circuit.

In the foregoing, the invention made by the inventors of the present invention has been concretely described based on the embodiments. However, it is needless to say that the present invention is not limited to the foregoing embodiments and various modifications and alterations can be made within the scope of the present invention. For example, it is possible to apply the detection signal SIG1 of the operating current detector circuit to the output signal of the power on reset circuit POR shown in FIG. 3, and it is also possible to provide a plurality of operating current detector circuits each having different current values to be detected for a plurality of signal processing circuits having different operating currents. In this case, the reference voltage passing through the voltage controlling current source can be adjusted in accordance with the target circuit. Also, the case of the semiconductor integrated circuit device mounted in the contactless IC card has been described above. However, the same effects can be achieved also in another semiconductor integrated circuit device having a voltage controlling circuit mounted therein by detecting the operation state of the voltage controlling circuit mounted therein.

The effects achieved by the present invention are as follows. That is, by permitting the operation of the internal signal processing circuit when it is determined that current passing through an internal voltage controlling circuit reaches a predetermined current, the signal processing circuit can be operated at a predetermined power supply voltage even when the current is changed due to the operation of the signal processing circuit. Consequently, it becomes possible to provide a signal processing circuit with a narrow power supply voltage range which can operate without malfunction, and thus, it is possible to reduce the characteristic change due to the change of the power supply voltage level and the malfunction due to the characteristic degradation.

The present invention can be preferably applied to an IC card and the like.

What is claimed is:

1. An IC card, comprising:
   an antenna for receiving alternate current superposed with an information signal;
   a rectifier circuit for receiving the alternate current received by said antenna and outputting rectifier voltage to obtain a direct power supply;
   a voltage controlling circuit for receiving the rectifier voltage outputted from said rectifier circuit and outputting an operating voltage which is a voltage difference between a first potential and a second potential;
   an internal circuit to which said operating voltage is supplied; and
   an operating current detector circuit for detecting current supplied by said operating voltage and outputting a detection signal indicating whether or not the current is higher than a predetermined current value,
   wherein said internal circuit is adapted to reset an internal state and to operate when receiving said detection signal at power on,
   wherein said voltage controlling circuit includes: a voltage comparator circuit which compares said operating voltage and a predetermined reference voltage; and a voltage controlling current source controlled by an output of said voltage comparator circuit, and
   said operating current detector circuit detects current passing through said voltage controlling current source and outputs said detection signal,
   wherein said voltage controlling circuit controls a voltage value of said operating voltage by subtracting the current supplied to the internal circuit from the current passing through said voltage controlling current source when said detection signal is named enable and said internal circuit starts to operate.

2. The IC card according to claim 1,
   wherein said internal circuit described in claim 1 has a central processing unit (CPU) and a co-processor, and
   said co-processor can operate when said detection signal is named enable.

3. The IC card according to claim 1, further comprising: a communication circuit including a receiver for demodulating the information signal superposed in the alternate current received from said antenna to output the signal as a digital information signal to said internal circuit and a transmitter for receiving digital information signal outputted from said internal circuit to form alternate current to be outputted from said antenna to outside.

4. The IC card according to claim 1, further comprising: a power on reset circuit for monitoring the voltage value of said operating voltage and outputting a reset signal,
   wherein said internal circuit includes a central processing unit (CPU) and a co-processor,
   said central processing unit starts to operate when said reset signal is named enable, and
   said co-processor is permitted to operate when said detection signal is named enable.

5. The IC card according to claim 1,
   wherein said voltage comparator circuit includes an operational amplifier for dividing said operating voltage to compare with said reference voltage,
   said voltage controlling current source includes a first MISFET whose gate is controlled by the output of said operational amplifier,
   said operating current detector circuit includes a first current source connected in series to a second MISFET between said first potential and said second potential,
   said operating current detector circuit detects a change in potential at a connection node between said first current source and said second MISFET to form said detection signal when the impedance of said second MISFET changes in response to the current passing through said first MISFET.

6. The IC card according to claim 5,
wherein gate potential of said second MISFET is controlled in accordance with the current passing through said first MISFET.
7. A semiconductor device, comprising:
a rectifier circuit for receiving alternate current supplied from outside and outputting rectifier voltage to obtain direct power supply;
a voltage controlling circuit for receiving said rectifier voltage and outputting operating voltage which is voltage difference between a first potential and a second potential; and
an internal circuit to which said operating voltage is supplied,
wherein said voltage controlling circuit includes a voltage controlling current source, and is adapted to allow said internal circuit to reset an internal state and to operate at power on when current passing through said voltage controlling current source is higher than a predetermined value, and to control said operating voltage by subtracting the current supplied to said internal circuit from the current passing through said voltage controlling current source when said internal circuit starts to operate.
8. An IC card, comprising:
an antenna adapted to receive alternate current superposed with an information signal;
a rectifier circuit adapted to receive the alternate current received by said antenna and to output a direct power supply voltage as a potential difference between a first voltage and a second voltage;
a voltage comparator circuit adapted to form a detection voltage corresponding to a change in said direct power supply voltage;
a voltage controlling current source adapted to pass current, of which an amount is controlled by said detection voltage, between said first voltage and said second voltage via said voltage controlling current source;
an internal circuit to which said direct power supply voltage is supplied; and
an operating current detector circuit adapted to detect said current and to output a detection signal when said current reaches a predetermined current;
wherein said internal circuit is adapted to reset an internal state and to operate when said detection signal is outputted to the internal circuit,
wherein said rectifier circuit, said internal circuit, and said operating current detector circuit are formed as a monolithic semiconductor integrated circuit on a silicon substrate, and
said semiconductor integrated circuit is mounted on a wiring circuit board on which said antenna is formed as an antenna coil by a wiring pattern and these are sealed with resin.
9. The IC card according to claim 8,
wherein a voltage value of said direct power supply voltage is controlled by the amount of said current.
10. The IC card according to claim 8,
wherein the internal circuit is a co-processor adapted to decode encoded data.
11. The IC card according to claim 8, further comprising:
a power on reset circuit adapted to monitor the voltage value of said operating direct power supply voltage and to output a reset signal, wherein said internal circuit comprises a central processing unit and a co-processor, said central processing unit being adapted to start to operate when said reset signal is enable, and said co-processor is adapted to operate when said detection signal is enable.
12. The IC card according to claim 8,
wherein said voltage comparator circuit comprises divider resistors connected in series between said first voltage and said second voltage and an operational amplifier circuit adapted to be inputted with a divided voltage at a first connection node between said divider resistors;
wherein said voltage controlling current source comprises a first MISFET whose gate is controlled by the output of said operational amplifier circuit,
wherein said operating current detector circuit comprises a first current source connected in series to a second MISFET between said first voltage and said second voltage,
wherein said operating current detector circuit is adapted to detect a change in potential at a second connection node between said first current source and said second MISFET to form said detection signal when the impedance of said second MISFET changes in response to the current passing through said first MISFET.
13. The semiconductor device according to claim 8;
wherein said predetermined current is an amount of current which is necessary to operate said internal circuit.
14. A semiconductor device, comprising:
a rectifier circuit adapted to receive alternate current supplied from outside and to output direct power supply voltage as a potential difference between a first voltage and a second voltage;
a voltage comparator circuit adapted to form a detection voltage corresponding to a change in said direct power supply voltage;
a voltage controlling current source adapted to pass current, of which an amount is controlled by said detection voltage, between said first potential and said second potential via said voltage controlling current source;
an internal circuit to which said direct power supply voltage is supplied; and
an operating current detector circuit adapted to detect said current when said current reaches a predetermined current;
wherein the internal circuit is adapted to reset an internal state and to operate at power on when said detection signal is outputted to the internal circuit,
wherein the voltage comparator circuit comprises divider resistors connected in series between said first voltage and said second voltage and an operational amplifier circuit adapted to be inputted with a divided voltage at a first connection node between said divider resistors;
wherein said voltage controlling current source comprises a first MISFET whose gate is controlled by the output of said operational amplifier circuit,
wherein said operating current detector circuit comprises a current mirror circuit adapted to transfer current passing through said first MISFET as source/drain current of a second MISFET and a first current source connected in series to the second MISFET of said current mirror circuit between said first voltage and said second voltage, and
wherein said operating current detector circuit is adapted to detect a change in potential at a second connection node between said first current source and said second MISFET to form said detection signal when the current passing through said second MISFET changes in response to the current passing through said first MISFET.

15. The semiconductor device according to claim 14, wherein said direct power supply voltage is controlled by the amount of said current.

16. The semiconductor device according to claim 14, wherein the voltage comparator circuit comprises divider resistors connected in series between said first voltage and said second voltage and an operational amplifier circuit inputted a divided voltage at a first connection node between said divider resistors;

wherein said voltage controlling current source comprises a first MISFET whose source and drain are connected between said first voltage and said second voltage and whose gate is controlled by the output of said operational amplifier circuit, wherein said operating current detector circuit comprises a first current source and a second MISFET, whose gate is controlled by the output of said operational amplifier circuit, connected in series between said first voltage and said second voltage, wherein a gate of said second MISFET is controlled by the output of said operational amplifier circuit; and wherein said operating current detector circuit is adapted to detect a change in potential at a second connection node (N12) between said first current source and said second MISFET and to form said detection signal.

17. The semiconductor device according to claim 16, wherein the voltage comparator circuit comprises divider resistances connected in series between said first voltage and said second voltage and an operational amplifier circuit adapted to be inputted with a divided voltage at a first connection node between said divider resistors;

wherein said operating current detector circuit further comprises a second current source and a third MISFET connected in series between said first voltage and said second voltage, and a low pass filter connected between a said second connection node and a gate of said third MISFET; and wherein said operating current detector circuit is adapted to detect a change in potential at a third connection node between said second current source and said third MISFET and to form said detection signal.

18. The semiconductor device according to claim 14; wherein said predetermined current is an amount of current necessary to operate said internal circuit.

* * * * *